(12) United States Patent
Brook et al.

(10) Patent No.: US 10,315,402 B2
(45) Date of Patent: Jun. 11, 2019

(54) TRANSFER FOR APPLICATION TO A SURFACE

(71) Applicant: Global Print Solutions Limited, Barnsley (GB)

(72) Inventors: Paul Timothy Brook, Barnsley (GB); Raymond Bungay, Crowle (GB); Melvyn Revitt, Sheffield (GB)

(73) Assignee: Conductive Transfers Limited, Birdwell, Barnsley (GB)

( * ) Notice: Subject to any disclaimer, the term of this patent is extended or adjusted under 35 U.S.C. 154(b) by 45 days.

(21) Appl. No.: 15/384,566

(22) Filed: Dec. 20, 2016

(65) Prior Publication Data
US 2018/0117895 A1    May 3, 2018

(30) Foreign Application Priority Data
Nov. 2, 2016   (GB) .................................. 16 18 462.4

(51) Int. Cl.
| | | |
|---|---|---|
| B32B 37/00 | (2006.01) | |
| B32B 37/06 | (2006.01) | |
| B32B 37/10 | (2006.01) | |
| B32B 38/00 | (2006.01) | |
| B32B 38/10 | (2006.01) | |
| H01L 21/683 | (2006.01) | |
| B44C 1/17 | (2006.01) | |
| B41M 3/12 | (2006.01) | |

(52) U.S. Cl.
CPC ............ *B32B 37/025* (2013.01); *B32B 37/06* (2013.01); *B32B 37/10* (2013.01); *B32B 38/145* (2013.01); *B44C 1/1733* (2013.01); *H01L 21/6835* (2013.01); *B32B 38/10* (2013.01); *B32B 2307/202* (2013.01); *B41M 3/12* (2013.01); *Y10T 156/109* (2015.01)

(58) Field of Classification Search
CPC . B32B 2307/202; B32B 37/025; B32B 37/06; B32B 37/10; B32B 38/145; B32B 7/00; B32B 38/10; B44C 1/1733; B41M 3/12; H01L 21/6835; Y10T 156/109
USPC ............. 156/244.12, 249, 277, 298; 427/152
See application file for complete search history.

(56) References Cited

U.S. PATENT DOCUMENTS 6,136,127 A * 10/2000 De Bastiani ............. B41M 3/12
156/230
6,136,129 A * 10/2000 Petkovsek .............. B42D 15/00
156/247

(Continued)

FOREIGN PATENT DOCUMENTS

| GB | 2555592 A | * | 5/2018 | ........... B32B 37/025 |
|---|---|---|---|---|
| JP | H02223438 A | | 9/1990 | |
| WO | 2011122623 A1 | | 10/2011 | |

OTHER PUBLICATIONS

English translation of JP2011207044.*
English translation of JP2223438.*

*Primary Examiner* — Sonya M Sengupta
(74) *Attorney, Agent, or Firm* — James Creighton Wray; Meera P. Narasimhan (57) ABSTRACT

A conductive transfer for application to a surface is described. The conductive transfer comprises first and second non-conductive ink layers and an electrically conductive layer positioned between the first and second non-conductive ink layers. The conductive transfer also includes an adhesive layer for adhering the conductive transfer to the surface of an article.

17 Claims, 12 Drawing Sheets

(56) References Cited

U.S. PATENT DOCUMENTS

| | | | | |
|---|---|---|---|---|
| 6,421,013 | B1* | 7/2002 | Chung | G06K 19/07749 |
| | | | | 343/700 MS |
| 7,017,822 | B2* | 3/2006 | Aisenbrey | G06K 19/07749 |
| | | | | 235/487 |
| 2008/0083721 | A1* | 4/2008 | Kaiserman | A43B 3/0005 |
| | | | | 219/211 |
| 2013/0004753 | A1* | 1/2013 | Majumdar | H01L 51/0024 |
| | | | | 428/209 |
| 2015/0040282 | A1* | 2/2015 | Longinotti-Buitoni | ...................... |
| | | | | A61B 5/6804 |
| | | | | 2/69 |
| 2015/0040283 | A1 | 2/2015 | Longinotti-Buitoni | |
| 2016/0046052 | A1 | 2/2016 | Ito | |

* cited by examiner

TRANSFER FOR APPLICATION TO A SURFACE

CROSS REFERENCE TO RELATED APPLICATIONS

This application claims priority from United Kingdom Patent Application No. 16 18 462.4, filed 2 Nov. 2016, the entire disclosure of which is incorporated herein by reference in its entirety.

BACKGROUND OF THE INVENTION

The present invention relates to a transfer for application to a surface, a method of producing such a transfer and a method of applying the transfer to the surface.

Transfer printing is often used to allow printed images and designs to be applied to available surfaces, for example, surfaces of articles made from fabrics, plastics or wood. Transfers are typically printed onto substrates of paper or film and then applied to any of the aforementioned surfaces using heat or pressure to result in the article having an appropriate image or design thereon. An example of this is a wearable item, such as a t-shirt, which can be manufactured with a printed image thereon originating from a transfer.

Transfers have therefore historically provided a means to provide visual improvements to objects but do not provide any further functionality beyond their visual appearance.

BRIEF SUMMARY OF THE INVENTION

According to an aspect of the present invention, there is provided a conductive transfer for application to a surface, comprising: a first non-conductive ink layer and a second non-conductive ink layer; an electrically conductive layer positioned between said first non-conductive ink layer and said second non-conductive ink layer; and an adhesive layer for adhering said conductive transfer to a surface.

According to a second aspect of the present invention, there is provided a method of producing a conductive transfer for application to a surface, comprising the steps of: printing a non-conductive ink onto a substrate to produce a first non-conductive ink layer; printing an electrically conductive ink onto said first non-conductive ink layer to produce an electrically conductive ink layer; printing said non-conductive ink over said electrically conductive layer to produce a second non-conductive ink layer; and printing an adhesive material over said second non-conductive ink layer to produce an adhesive layer.

According to a third aspect of the present invention, there is provided a method of applying a conductive transfer to a surface, comprising the steps of: obtaining a conductive transfer having a first non-conductive ink layer, a second non-conductive ink layer, and an electrically conductive layer positioned between said first non-conductive ink layer and said second non-conductive ink layer; positioning said conductive transfer onto a surface; and applying at least one of heat or pressure to said conductive transfer such that said conductive transfer adheres to said surface.

DETAILED DESCRIPTION OF THE INVENTION

Figure 1:
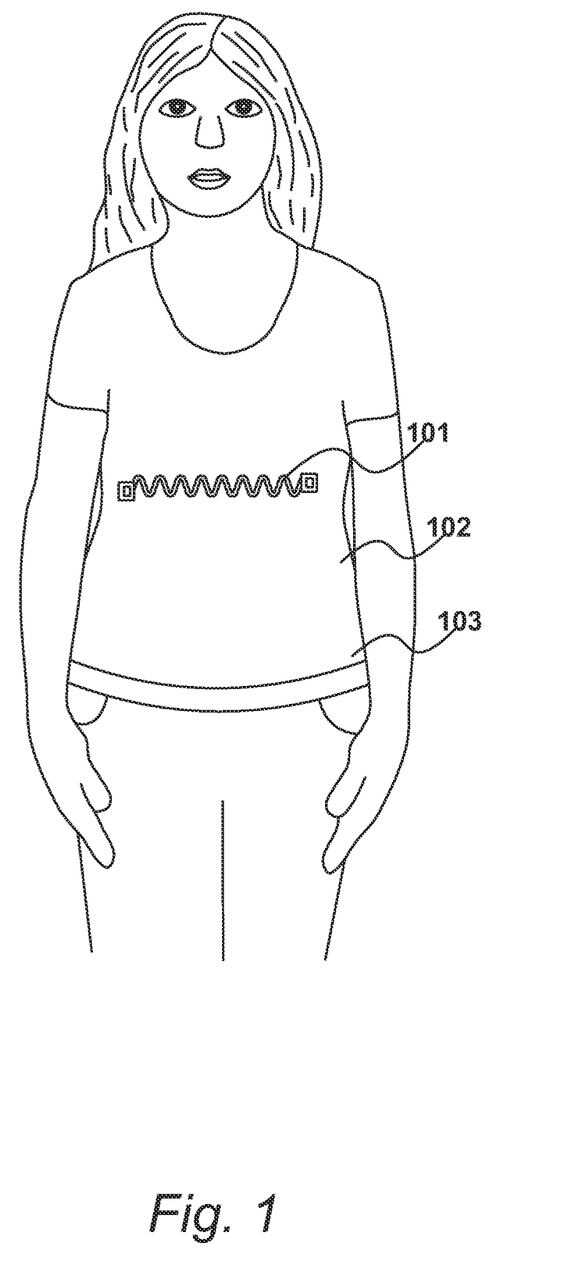
FIG. 1 shows an example application utilizing a conductive transfer.

FIG. 1

An example embodiment illustrating use of a conductive transfer according to an aspect of the present invention will be described in FIG. 1. Conductive transfer 101 is shown having been applied to a surface 102 in which surface 102 comprises a fabric which forms part of wearable item 103.

Conductive transfer 101 has been successfully applied to surface 102 by means of the method as will be described herein with reference to FIGS. 10 to 12. Once applied, wearable item 103 comprising conductive transfer 101 can be worn in a substantially similar manner to conventional wearable items without having undue effect on the conductive transfer itself.

Wearable item 103 comprises any suitable type of fabric typically used in the clothing industry including cottons, nylon, polyesters and/or waterproof materials. When forming part of a wearable item these materials are typically configured to be washable up to ninety degrees Celsius (90° C.) in line with conventional washing practices. It is appreciated that materials which can be washed at temperatures above and below ninety degrees Celsius (90° C.) are also used. Thus, conductive transfer 101 is also configured to withstand conventional washing at these temperatures without any adverse effects to the functionality of conductive transfer 101.

Conductive transfer 101 may provide an aesthetic appearance to wearable item 103 but, in accordance with the present invention, conductive transfer 101 in particular provides additional functionality and electrically conductive means such that conductive transfer 101 may form part of an electrical circuit. This enables wearable item 103 to support electronic devices for example, lights, sensors, or other electrical components. For example, in an embodiment, conductive transfer 101 comprises GPS capabilities which are utilized as a tracking device. Thus, the conductive transfer can be applied to wearable items for children so that parents or caregivers can monitor the location of the children. In an alternative embodiment, a substantially similar arrangement can be utilized for monitoring people checking in and out of restricted areas.

It is appreciated that in order to be used in conjunction with the wearable item, conductive transfer 101 is configured to withstand elongation or stretching such that even when stretched conductive transfer 101 provides a resistance within a specified range such that the conductive capabilities of conductive transfer 101 do not degrade if the wearable item 103, and consequently the conductive transfer 101, are stretched. For example, in an embodiment, conductive transfer 101 provides a resistance of at least twenty milliohms per square (10 mΩ/sq) at twenty five microns (25 μm) or more.

In the illustrated embodiment, conductive transfer 101 includes an aesthetic element such that a person can see the conductive transfer 101 on wearable item 103. It is appreciated that however, in alternative embodiments, the conductive circuit can be hidden from view while still comprising part of wearable item 103. In these embodiments, conductive transfer 101 does not provide an aesthetic element, but does provide electrically conductive functionality.

The example shown in FIG. 1 is illustrative of an application in which conductive transfer 101 may be used. However, it is appreciated that conductive transfer 101 may be applied to any surface comprising any alternative material such as plastics, ceramics or wood. Thus, conductive transfer could be used in a similar manner on cups, bottles, furniture surfaces or any other suitable article having a suitable surface. In an example embodiment, conductive transfer 101 is applied to a patient's garment in order to monitor their heart rate or other functions such as their blood pressure. In a further embodiment, conductive transfer 101 is applied to a fabric bed sheet and utilized to monitor bed/pressure sores of a patient in a hospital bed.

Figure 2:
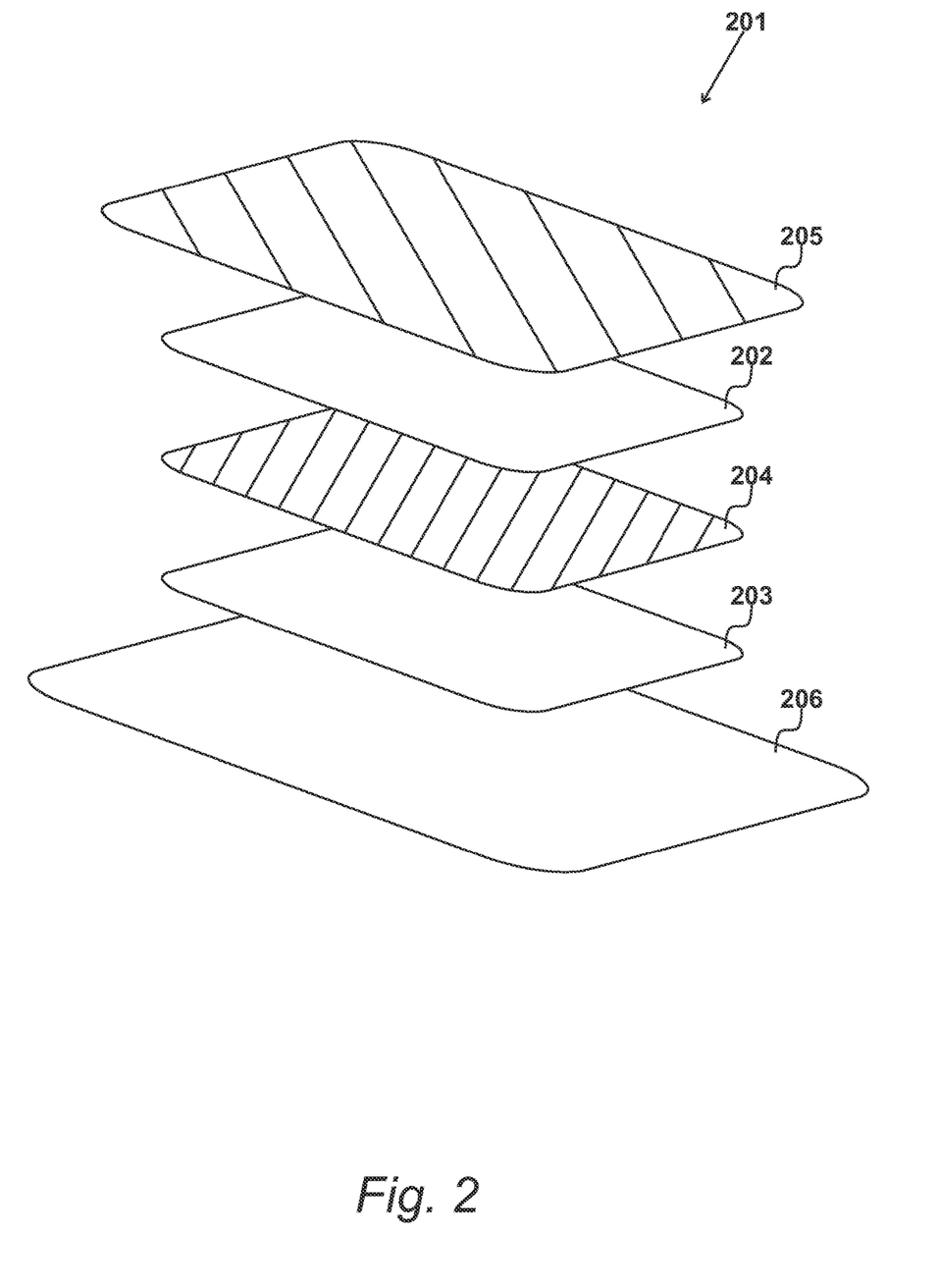
FIG. 2 shows an exploded diagrammatic view of a conductive transfer.

FIG. 2

An exploded diagrammatic view of a conductive transfer 201 in accordance with the present invention is described in FIG. 2. Conductive transfer 201 comprises four layers and a substrate and is suitable for use in the manner described previously in FIG. 1.

Conductive transfer 201 comprises non-conductive ink layer 202 and non-conductive ink layer 203. Positioned between non-conductive ink layer 202 and non-conductive ink layer 203 is electrically conductive layer 204. Positioned on the opposite side of non-conductive ink layer 202 to electrically conductive layer 204 is an adhesive layer 205. These layers are applied to a substrate 206 which is positioned on the opposite side of non-conductive ink layer 203 to electrically conductive layer 204.

Non-conductive ink layer 202 and non-conductive ink layer 203 each comprises a suitable printing ink which comprises any one of the following: a water based printing ink; an ultraviolet cured printing ink; a solvent based ink; or a latex printing ink. Any other printing ink may be used in alternative embodiments. In the embodiment, non-conductive ink layer 202 and non-conductive ink layer 203 each comprises a printing ink which is white in color as this provides a suitable background should any overprinting be required, for example, if an aesthetic element is included. It is appreciated, however, that any other colored ink can be used as required by the application. In the embodiment, the non-conductive ink comprises a screen printable ink of CMYK toner.

Electrically conductive layer 204 comprises any suitable conductive ink of any specified resistance and is configured to provide a conductive path on application of an electric current or voltage. The conductive ink which is comprised in electrically conductive layer 204 may be supplied by Engineering Materials Systems Inc., Delaware and supplied under the name of ECM (Engineered Conductive Materials).

It is appreciated that conductive ink from any other approved supplier can be used.

Electrically conductive layer 204 is shown in FIG. 2 as comprising a solid layer of conductive ink. It is appreciated, however, that electrically conductive layer 204 can be printed in any suitable pattern or electrical circuit as will be described by example in FIG. 5. Similarly, corresponding arrangements in respect of non-conductive ink layer 202, non-conductive ink layer 203 and adhesive layer 205 may be printed in corresponding patterns depending on requirements. It is therefore appreciated that the shape of each layer is non-limiting and further that each layer does not have to be printed in a solid unbroken manner.

Adhesive layer 205 is suitable for adhering the conductive transfer 201 to any suitable surface such as those as previously described with reference to FIG. 1. The adhesive layer may comprise a water based adhesive, a solvent based adhesive, a printable adhesive, a powder adhesive or any other suitable adhesive which is capable of adhering conductive transfer 201 to a surface. In one embodiment, adhesive layer 205 comprises a printable adhesive which is substantially transparent. This type of adhesive is able to withstand higher temperatures compared to available powder adhesives and is also suitable for use on colored surfaces without being substantially visible to the human eye. It is appreciated that, in alternative embodiments, non-transparent adhesives are used which are capable of adhering the conductive transfer to a surface.

In the embodiment, substrate 206 is a polyester film onto which layers 202, 203, 204 and 205 are printed thereon. In an alternative embodiment, substrate 206 comprises a paper film, coated paper or TPU (thermoplastic polyurethane).

In the embodiment, conductive transfer 201 comprises four layers and a substrate which requires a four pass transfer printing process. It is appreciated that in alternative embodiments, any number of layers may utilized to provide increased functionality. For example, in an embodiment, there are several electronic devices which utilize separate electrically conductive layers to provide further functionality to the article onto which the conductive transfer is to be applied.

Figure 3:
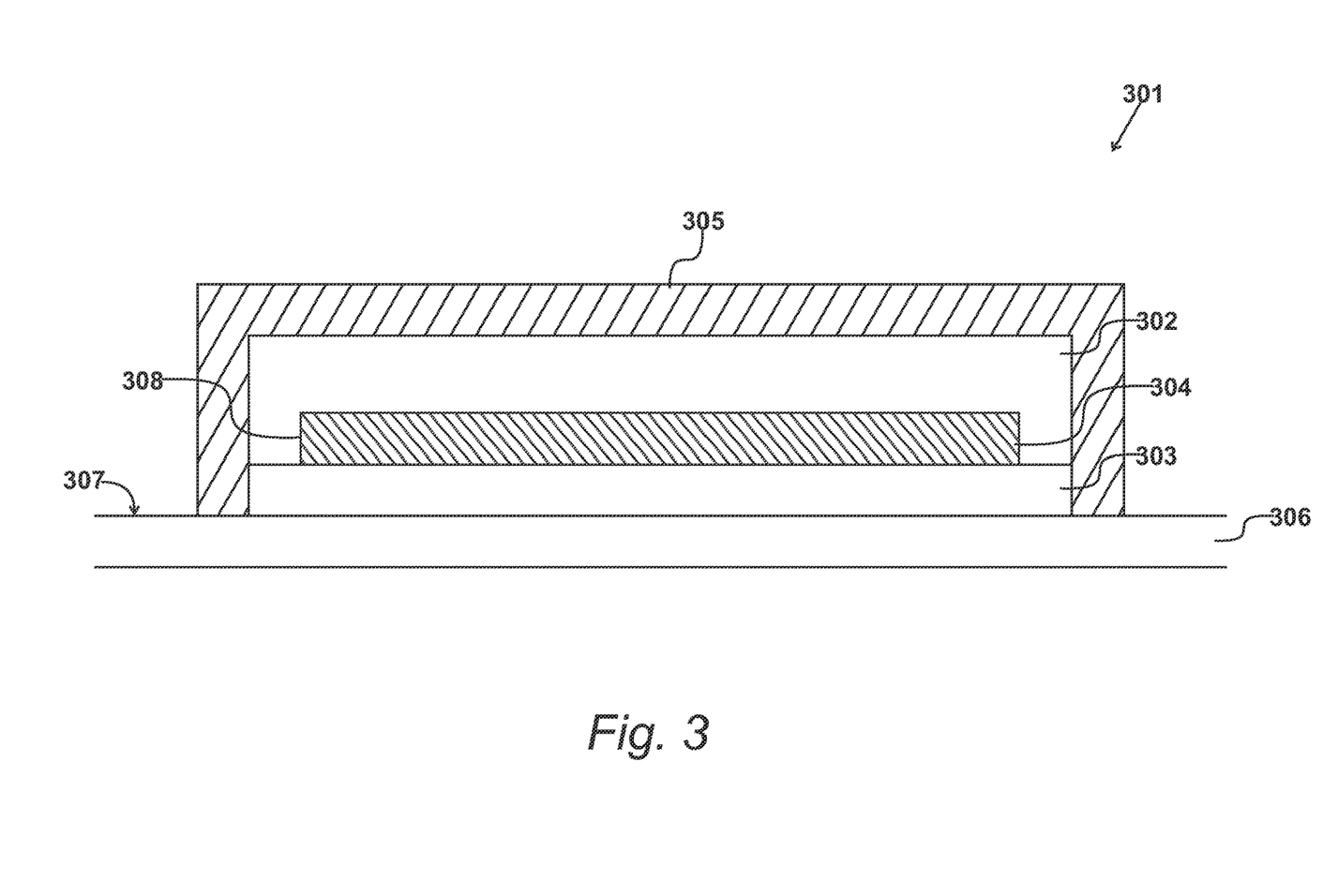
FIG. 3 shows a diagrammatic cross sectional view of an example embodiment of a conductive transfer.

FIG. 3

A conductive transfer 301 is shown in FIG. 3 in a cross-sectional manner as if taken through the layers of a similar arrangement to that as shown in FIG. 2.

Conductive transfer 301 comprises non-conductive ink layer 302, non-conductive ink layer 303 and electrically conductive layer 304 positioned between non-conductive ink layer 302 and non-conductive ink layer 303. Conductive transfer 301 further comprises an adhesive layer 305 for adhering conductive transfer 301 to a suitable surface. Conductive transfer 301 also includes a substrate 306 onto which each of the layers are printed.

Each of the layers 302, 303, 304 and 305 are printed directly onto a top surface 307 of substrate 306. As will be described further with reference to FIGS. 6 to 9, the printing process involves printing non-conductive ink layer 303 directly onto surface 307. Electrically conductive layer 304 is then printed on top of non-conductive ink layer 303 before being over printed by non-conductive ink layer 302. Given that electrically conductive layer 304 is printed on top of non-conductive ink layer 303 and over printed by non-conductive ink layer 302 it can be seen that electrically conductive layer 304 is encapsulated by the two non-conductive ink layers 302 and 303. This can be achieved by printing a larger surface area of non-conductive ink 303 compared to the conductive ink of conductive layer 304.

When non-conductive ink is applied to form non-conductive ink layer 302, this ink may also comprise a larger surface area than the conductive layer 304 and thus non-conductive ink forming a part of non-conductive ink layer 302 covers the edges, such as edge 308, of conductive layer 304. Thus, electrically conductive layer 304 is retained within the non-conductive ink layers 302 and 303. In other embodiments, such as that described in FIG. 4, a smaller surface area of non-conductive ink can be printed which partially reveals at least some of the conductive ink layer.

Following printing of non-conductive ink layer 302, adhesive layer 305 is applied over non-conductive ink layer 302. In this illustrated embodiment, adhesive layer 305 comprises a larger cross-sectional area than each of non-conductive ink layer 302 and non-conductive ink layer 303 and electrically conductive layer 304. Thus, when adhesive layer 305 is printed over non-conductive ink layer 302, adhesive layer 305 overlays non-conductive ink layer 302 and extends beyond each of non-conductive ink layer 302 and non-conductive ink layer 303 as well as electrically conductive layer 304. Adhesive layer 305 also contacts top surface 307 of substrate 306. While in this particular embodiment adhesive layer 305 could be considered to encapsulate the non-conductive ink layers in combination with substrate 306, it is appreciated that once the conductive transfer is applied to a suitable surface whereby adhesive layer 305 contacts the surface, substrate 306 is removed such that non-conductive ink layer 303 becomes exposed.

While it is noted that the diagrammatic cross-sectional representation shown in FIG. 3 implies a substantial thickness of the layers, in practice, conductive transfer 301 is typically between zero point five millimeters and five millimeters (0.5 mm and 5 mm) in thickness through the layer and from the bottom edge of substrate 306 to the top edge of adhesive layer 305. It is appreciated that, in embodiments where the number of layers are altered, the thickness is altered as a consequence and the transfer may have a larger or smaller thickness. It is further appreciated that when each of the inks of the respective layers is printed they will automatically contact the surface 307 or substrate 306 if they are printed larger than the previous layers surface area.

Figure 4:
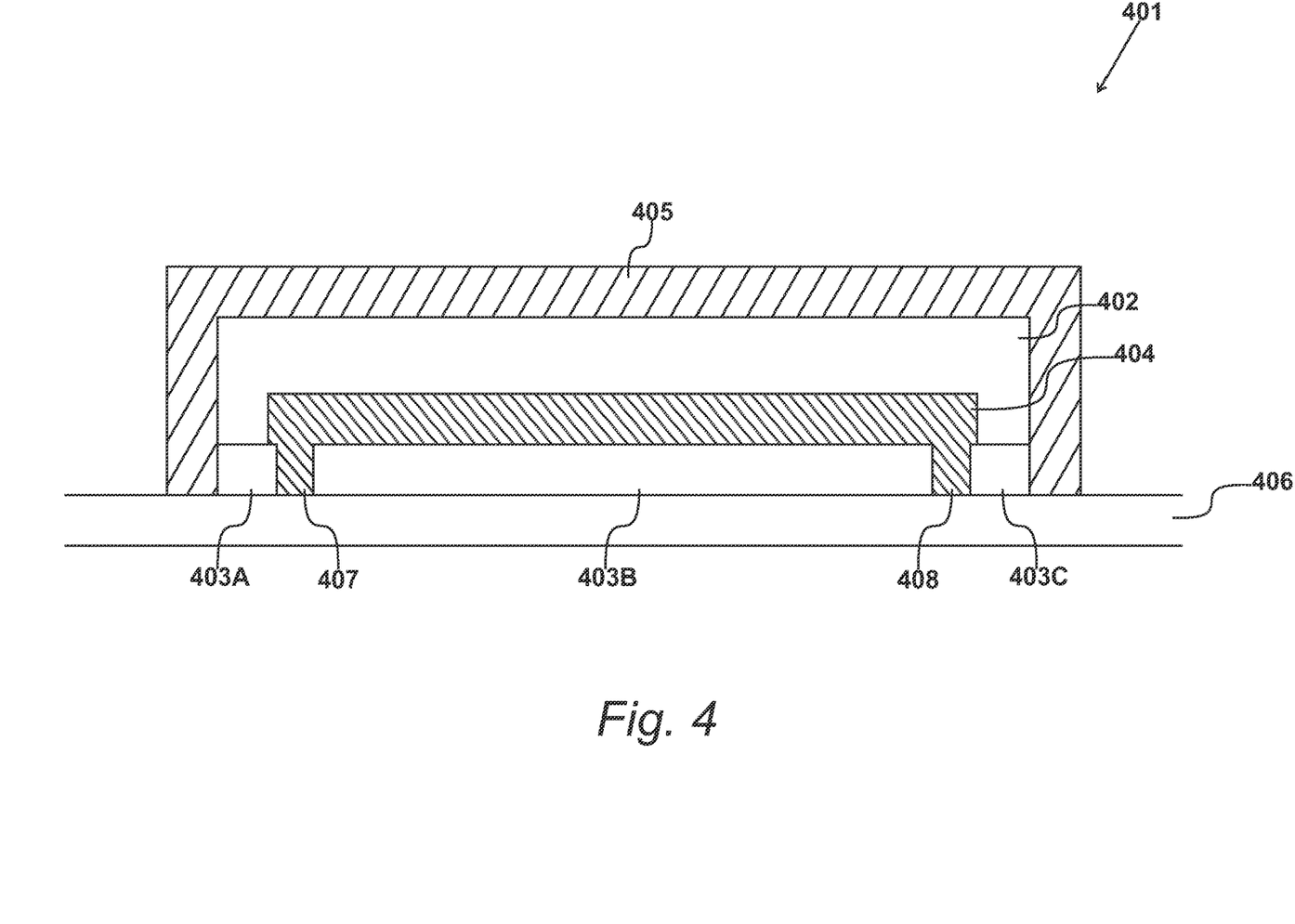
FIG. 4 shows an alternative conductive transfer in a diagrammatic cross sectional view.

FIG. 4

An alternative conductive transfer 401 showing an alternative embodiment will now be described with respect to FIG. 4. Again, conductive transfer 401 is shown in a diagrammatic cross-sectional view taken through the layers in a substantially similar manner to FIG. 3.

Conductive transfer 401 comprises a first non-conductive ink layer 403. In this particular embodiment, electrically conductive layer 404 has been printed in the form of an electrical circuit which, for a given cross-section presents separate portions which are indicated as portions 403A, 403B and 403C. It is appreciated that in manufacture, each of the portions 403A, 403B and 403C are printed on the same run and form a single layer which includes gaps as necessary. In this example, this includes gaps indicated at 407 and 408 which separate portions 403A and 403B and portions 403B and 403C respectively.

Conductive transfer 401 further comprises a second non-conductive ink layer 402. In a similar manner to the embodiment of FIG. 3, conductive transfer 401 also comprises an adhesive layer 405 which is suitable for adhering conductive transfer 401 to a suitable surface.

Further, in a substantially similar manner to conductive transfer 301, the respective layers of conductive transfer 401 have been printed onto substrate 406. Over a portion of conductive transfer 401 where first non-conductive ink layer 403 consists of portion 403B the corresponding portion of electrically conductive layer 404 is encapsulated between the non-conductive ink layer 403B and non-conductive ink layer 402 in this area. In addition, at the gaps 407 and 408, electrically conductive layer 404 is exposed to provide contact points in these areas.

Thus, it is appreciated that, depending on the arrangement of the design of the conductive transfer, any number of exposed points of the conductive layer can be present to allow direct access to the electrically conductive circuitry within electrically conductive layer 404 of conductive transfer 401. However, for the remainder of the conductive transfer, it is appreciated that the non-contact points are suitably encapsulated by the two non-conductive ink layers to prevent exposure of the conductive layer. This ensures that the electrically conductive layer is sandwiched between the two non-conductive ink layers and kept in a waterproof environment such that, when applied to a suitable surface, the surface in combination with the conductive transfer can be washed without damage to electrically conductive layer 404. Thus, in the example shown in FIG. 1 wherein the surface forms part of a wearable item, the wearable item would be able to be put in a washing machine without the electrically conductive layer suffering a loss of functionality with respect to the electrically conductive layer itself.

Figure 5:
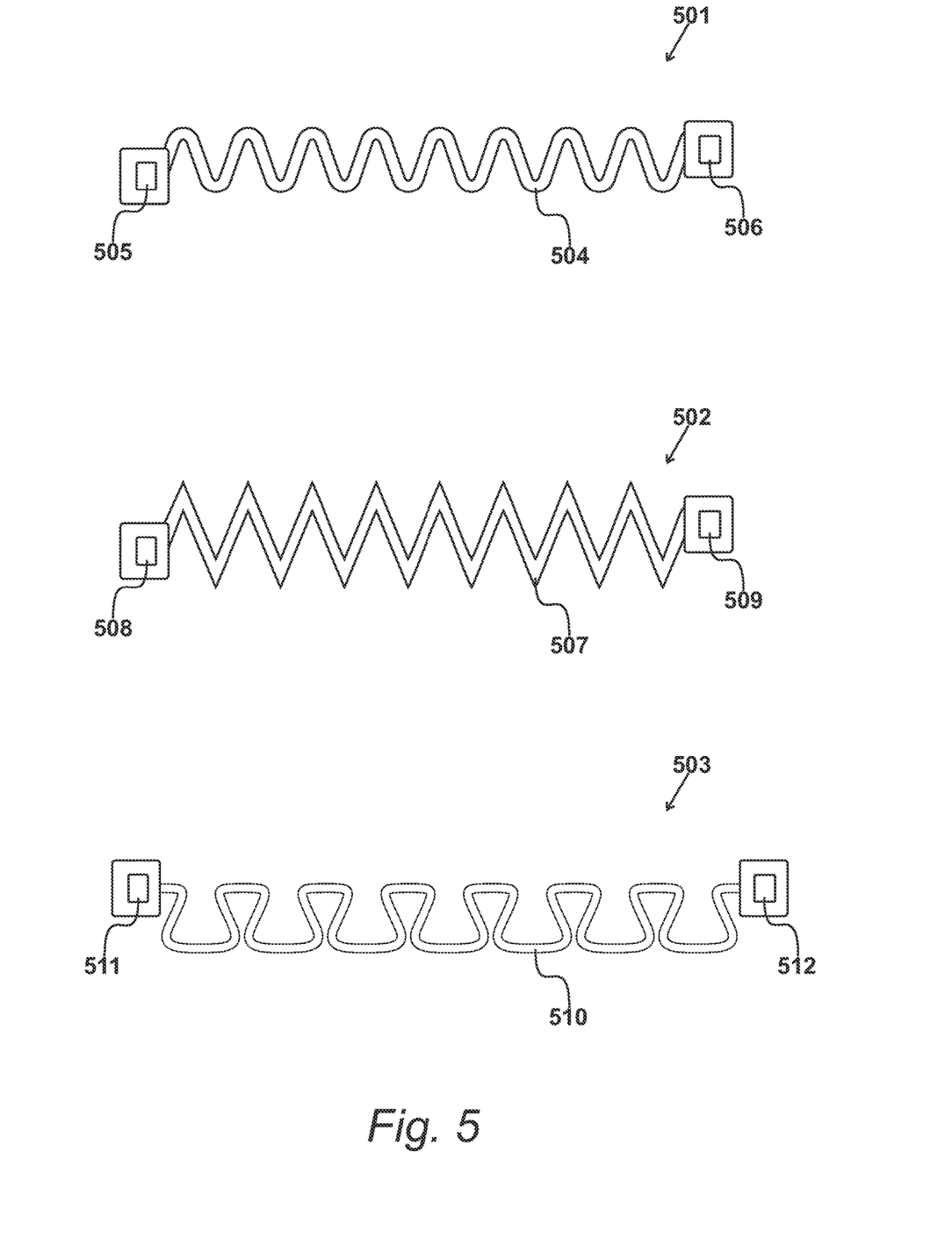
FIG. 5 shows example arrangements for designs for use in conductive transfers of the type described herein.

FIG. 5

Example arrangements for designs that could be utilized for conductive transfers such as those described previously are illustrated in respect of FIG. 5. FIG. 5 indicates three separate alternative designs for conductive transfers 501, 502 and 503. In each of the illustrated embodiments, the conductive transfers 501, 502 and 503 have an arrangement substantially similar to that of FIG. 4 in which the respective electrically conductive layers of each conductive transfer is encapsulated by a first non-conductive ink layer and a second non-conductive ink layer over a first area and exposed to provide a contact point in a second area.

Referring to conductive transfer 501, conductive transfer 501 comprises a geometric waveform and, in this embodiment, geometric waveform 504 comprises a sine wave. At each end of sine wave 504 are contact points 505 and 506 in which a portion of the electrically conductive layer has been exposed to enable a connection to be made to the encapsulated electrical circuit within sine wave 504.

In a similar manner, conductive transfer 502 comprises a geometric waveform which, in this case, comprises a triangular wave 507. Across triangular wave 505 the electrically conductive ink layer is encapsulated within two non-conductive ink layers and, at contact points 508 and 509, the electrically conductive layer is exposed to provide a contact point.

A further example of a geometric waveform forming a conductive transfer 503 also indicates further contact points 511 and 512 which are exposed in a similar manner.

It is appreciated that these three waveforms are shown as examples which may be utilized in respect of the present invention however, any design shape could be utilized to provide a conductive transfer. In particular however, geometric waveforms such as the examples described in respect of FIG. 5 have shown in test to enable improved elongation and stretching properties without substantial loss of functionality in respect of the resistance of the electrically conductive layer. Thus, if a geometric waveform is used in the conductive transfer design on a stretchable wearable item, the wearable item can be stretched without damage to the conductive ink layer. The geometric waveforms prevent cracking in the conductive ink which thereby increases durability of the conductive transfer when used in this manner. It is appreciated however that for non-stretchable surfaces, this requirement is not required and all other suitable designs can be utilized.

Figure 6:
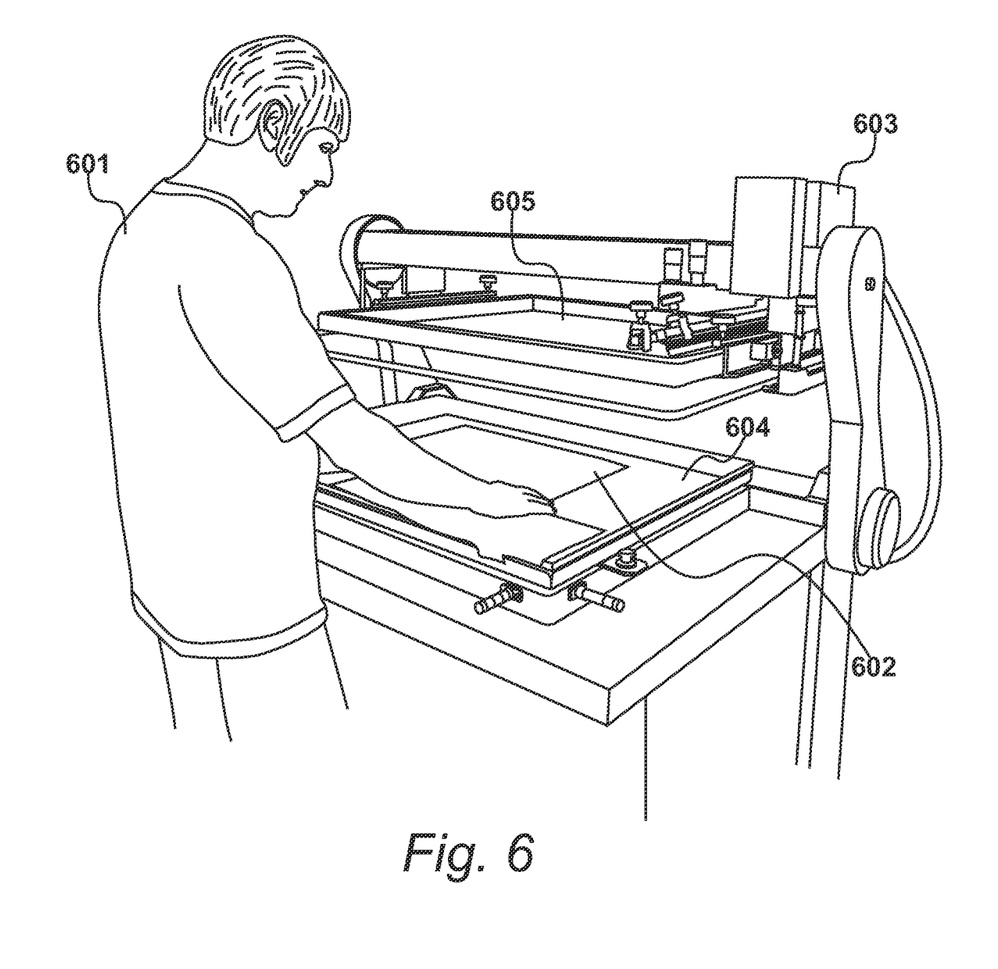
FIG. 6 shows a method of producing a conductive transfer utilizing a screen-printing process.

FIG. 6

A method of producing any one of the conductive transfers previously described, such as conductive transfers 101, 201, 301, 401, 501, 502 or 503, will now be described with reference to FIGS. 6 to 9.

The method will be described with respect to a screen printing process. It is appreciated however that as an alternative to screen printing, the method may be conducted by any other form of printing such as reel-to-reel printing, dot matrix printing, laser printing, cylinder press printing, ink jet printing, flexographic printing, lithographic printing, offset printing, digital printing, gravure printing or xerographic printing. It is further appreciated that the invention is not limited to these methods. In order to produce one of the conductive transfers previously described an operative 601 places a suitable substrate on 602 onto a screen printing machine 603. In this embodiment, the substrate comprises a sheet of polyester film which is any suitable size but may be for example A4, or A3 or larger sizes. It is further appreciated that when using reel-to-reel printing the film is provided from a roll of material rather than a sheet.

In the embodiment screen printing machine 603 is semi-automatic. The substrate 602 is laid on the printing surface 604 ready for ink to be provided through a screen 605. Screen 605 includes a mesh or stencil which illustrates the design to be printed.

Figure 7:
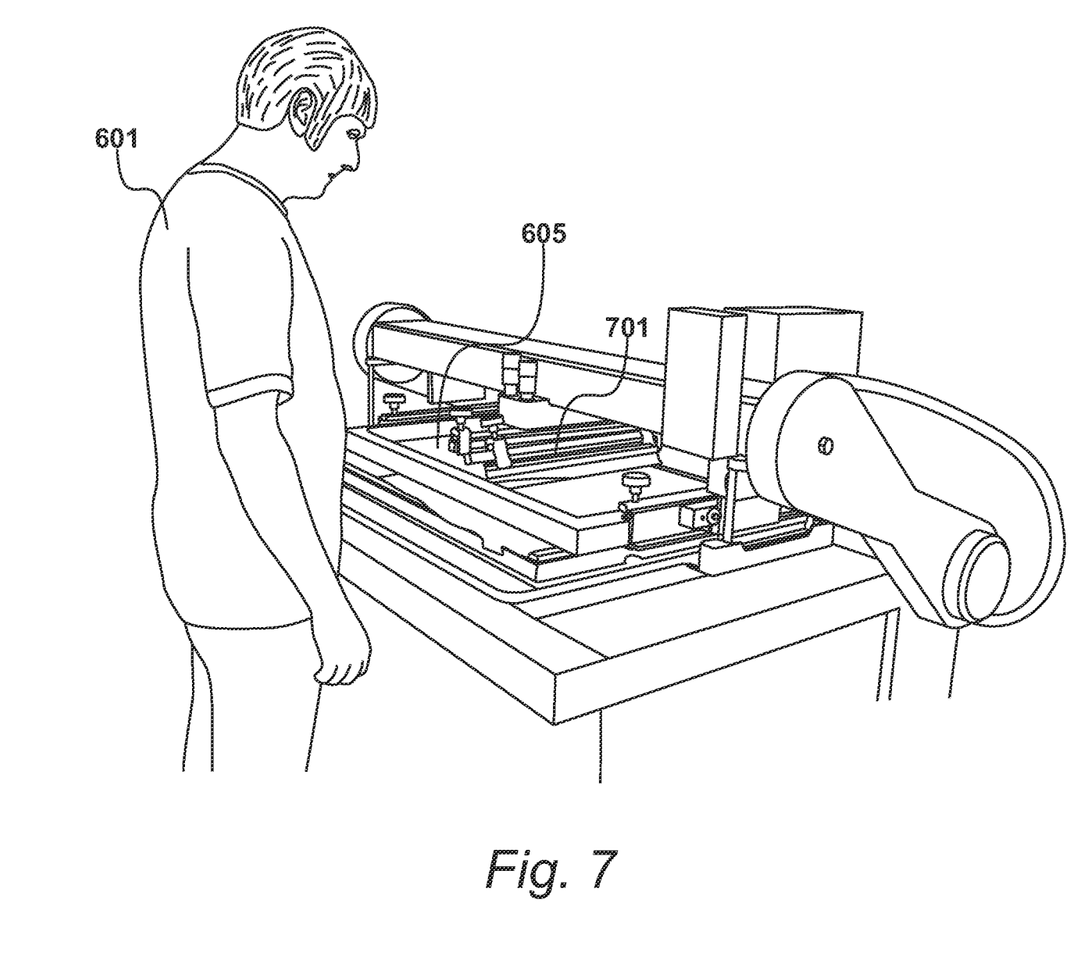
FIG. 7 shows a further step in the method of producing a conductive transfer.

FIG. 7

Ink is applied to screen 605 as screen 605 is lowered into contact with substrate 602. A squeegee head 701 moves across screen 605 and pushes the appropriate ink onto the substrate in line with the design on the mesh.

It is appreciated that for each different design the mesh or stencil needs to be replaced and for each different type of ink the screen requires cleaning. Thus, in manufacture each layer is batch printed before the next layer is printed over the top for each batch.

It is further appreciated that alternatives to the semi-automatic machine can be used such of those of the carousal type which are able to print several different inks at once. The semi-automatic system typically produces between around two hundred (200) sheets and two hundred and fifty (250) sheets per hour. For higher production, a fully automatic system is typically able to produce fifteen hundred (1500) sheets to two thousand (2000) sheets per hour.

Figure 8:
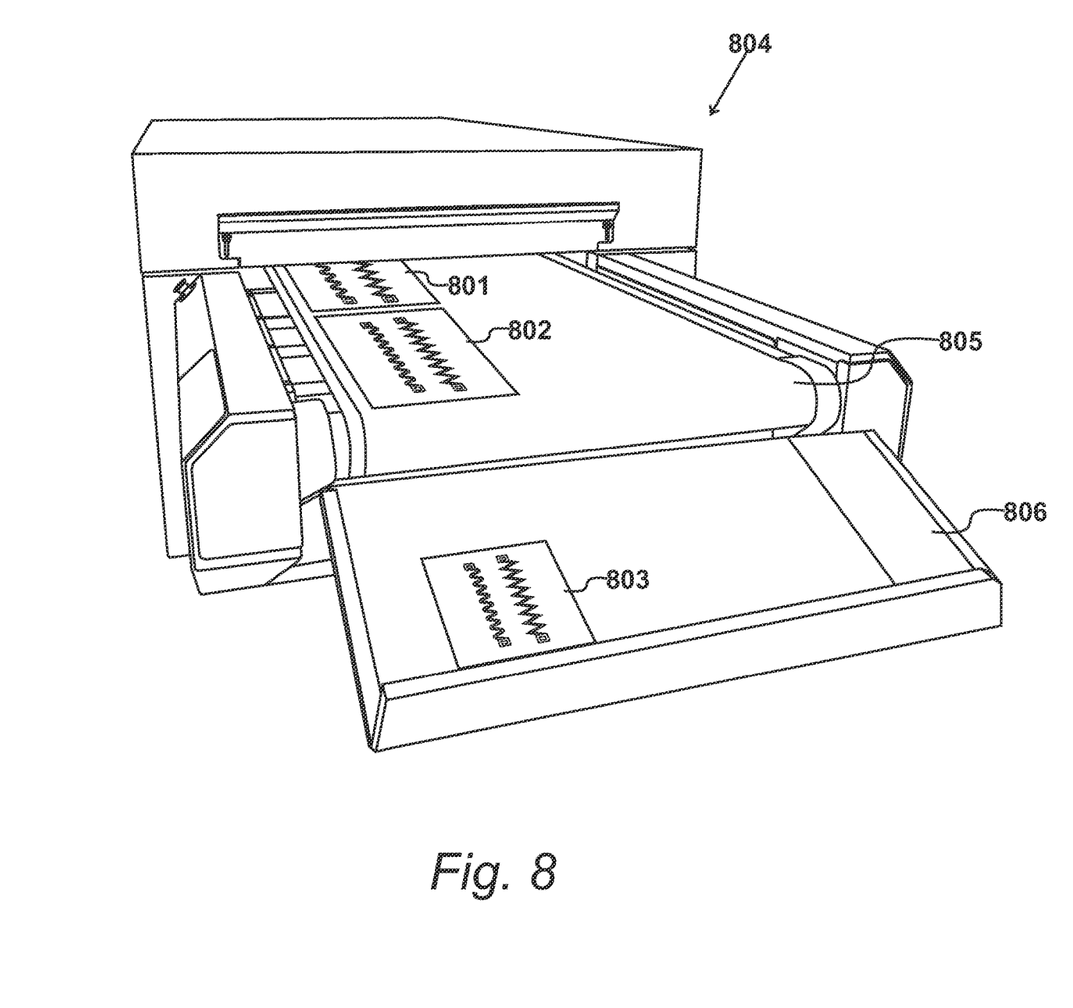
FIG. 8 shows a curing stage in the method of producing a conductive transfer.

FIG. 8

Once the appropriate layer has been printed onto the substrate 602, the substrate sheets indicated at 801, 802 and 803, are processed through a curing machine 804. In this embodiment, the curing machine comprises a dryer which provides a hot air flow onto sheets 801, 802 and 803 to enable the inks to be cured effectively.

In the embodiment, the blown air temperature inside the dryer is typically set at one hundred and twenty degrees Celsius (120° C.) for three minutes for the non-conductive ink layers. For the electrically conductive ink layer the temperature is raised to typically one hundred and thirty degrees Celsius (130° C.) for three minutes. In the embodiment, the dryer used includes a three (3) meter drying section. It is appreciated that the temperatures indicated here are dependent on the curing system used and the temperatures indicated can be lower or higher depending on the system. In addition, the time taken to dry each sheet can also vary depending on the temperatures and also the length of the drying section.

This step is particularly important as in order to achieve the encapsulation of the electrically conductive layer, the non-conductive ink layers need to be solidified appropriately to avoid cross contamination of each of the layers.

Curing machine 804 includes a conveyor 805 which transports the cured sheets out of the machine 804 and into a holding tray 806. Thus, when all sheets of the batch have been completed they can be collected for either the next application of the next layer or for application to a suitable surface of an article. Alternatively, it is appreciated that the completed sheets may be supplied to a customer such that the customer may apply the conductive transfers to their own surfaces and/or articles.

Figure 9:
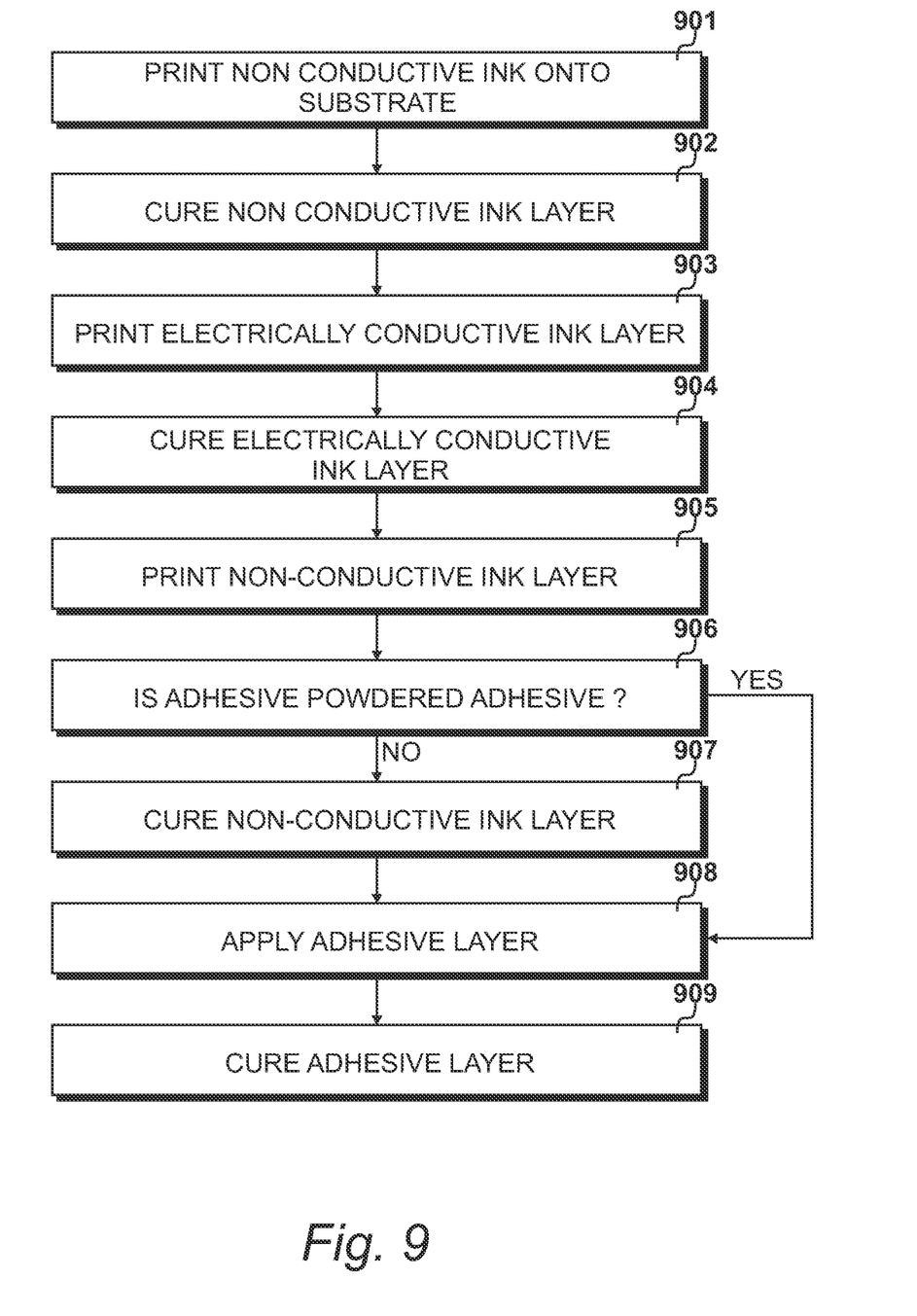
FIG. 9 shows a flow chart illustrating a method of producing a conductive transfer.

FIG. 9

The method of producing a conductive transfer for application to a surface is illustrated in the flow chart of FIG. 9. At step 901 a non-conductive ink is printed onto a substrate to produce a first non-conductive ink layer. With reference to FIGS. 2 to 4, this corresponds to conductive layers 203, 303 and 403. This may be achieved by the method described in respect of FIGS. 6 and 7.

At step 902 the printed non-conductive ink layer is processed through the curing machine 804 and suitably cured and dried in the manner of FIG. 8.

Once the first non-conductive ink layer has been suitably cured the screen on the screen printer of FIGS. 6 and 7 is changed to that required for the electrically conductive layer. Following this, at step 903, an electrically conductive ink is printed over the first non-conductive ink layer to produce the electrically conductive ink layer, such as electrically conductive layers 204, 304 or 404.

In a similar manner, the electrically conductive ink layer is cured through the heating and drying process of FIG. 8 at step 904 before the second non-conductive ink layer is produced by printing the same non-conductive ink over the electrically conductive layer at step 905.

If a printable adhesive is being used as opposed to a powered adhesive then the second non-conductive ink layer is cured in a substantially similar manner to those previously as indicated at steps 906 and 907. However, if the adhesive layer comprises a powdered adhesive then the adhesive layer is applied to the second non-cured non-conductive ink layer at step 908 before curing of the adhesive layer is conducted at step 909.

With this in mind, it is appreciated that while the conventional method is to cure each ink layer following each application of a layer these steps may be adapted or removed as necessary. Thus, the steps may be varied depending on requirements notwithstanding the need to suitably encapsulate at least part of the conductive transfer within the two non-conductive ink layers.

Figure 10:
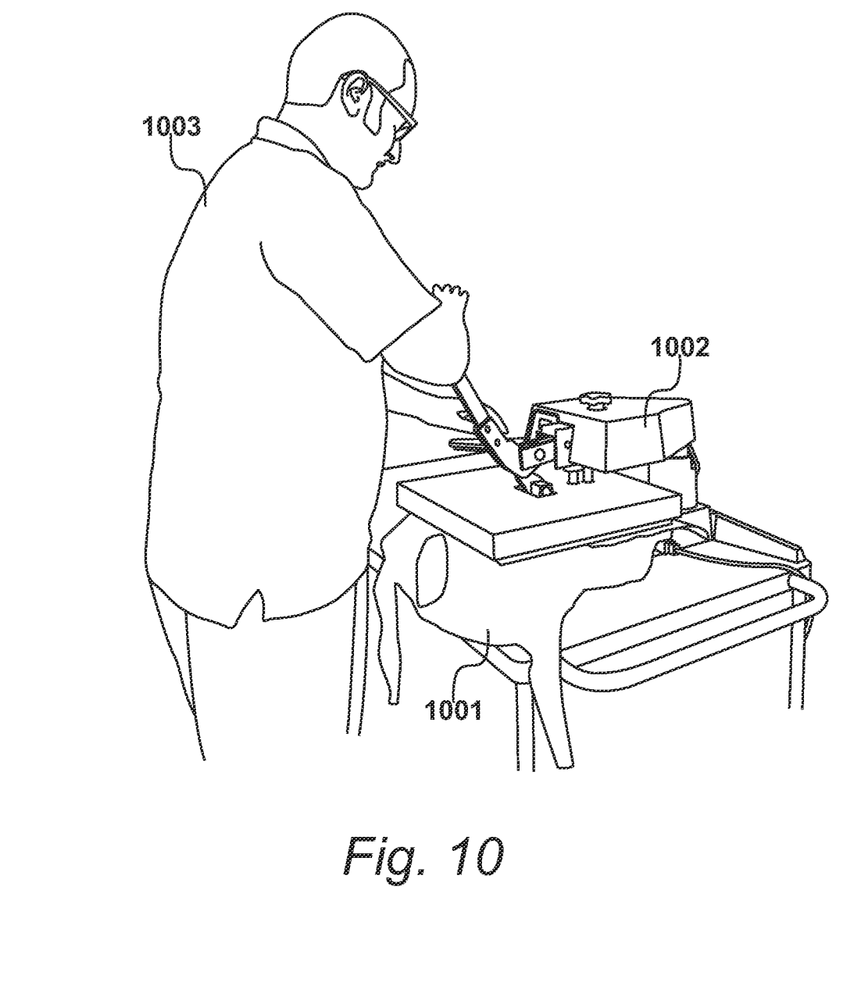
FIG. 10 shows a step in the application of a conductive transfer to a surface of an article.

FIG. 10

Following the production of the conductive transfer as described in FIGS. 7 to 9, the conductive transfer can be applied to a surface of an article such as the wearable item described in respect of FIG. 1. The conductive transfer, such as conductive transfer 101, 201, 301, 401, 501, 502 or 503, is placed on the surface of wearable item 1001.

Wearable item 1001 and the conductive transfer are then placed into a machine such as heat press 1002. Operative 1003 then activates heat press 1002 to provide heat and pressure to the conductive transfer such that the conductive transfer adheres to the surface of wearable item 1001. In order to achieve this it is appreciated that the adhesive layer is placed in contact with the surface of wearable item 1001 with the substrate forming the further most layer from surface 1001.

In the embodiment, the heat press applies a pressure substantially within a range of one hundred and forty five to one hundred and eighty degrees Celsius (145-180° C.). In a particular embodiment the temperature applied is one hundred and sixty-five degrees (165° C.). It is appreciated that these temperatures are dependent on the type of heat press utilized in the manufacture of the conductive transfer.

Figure 11:
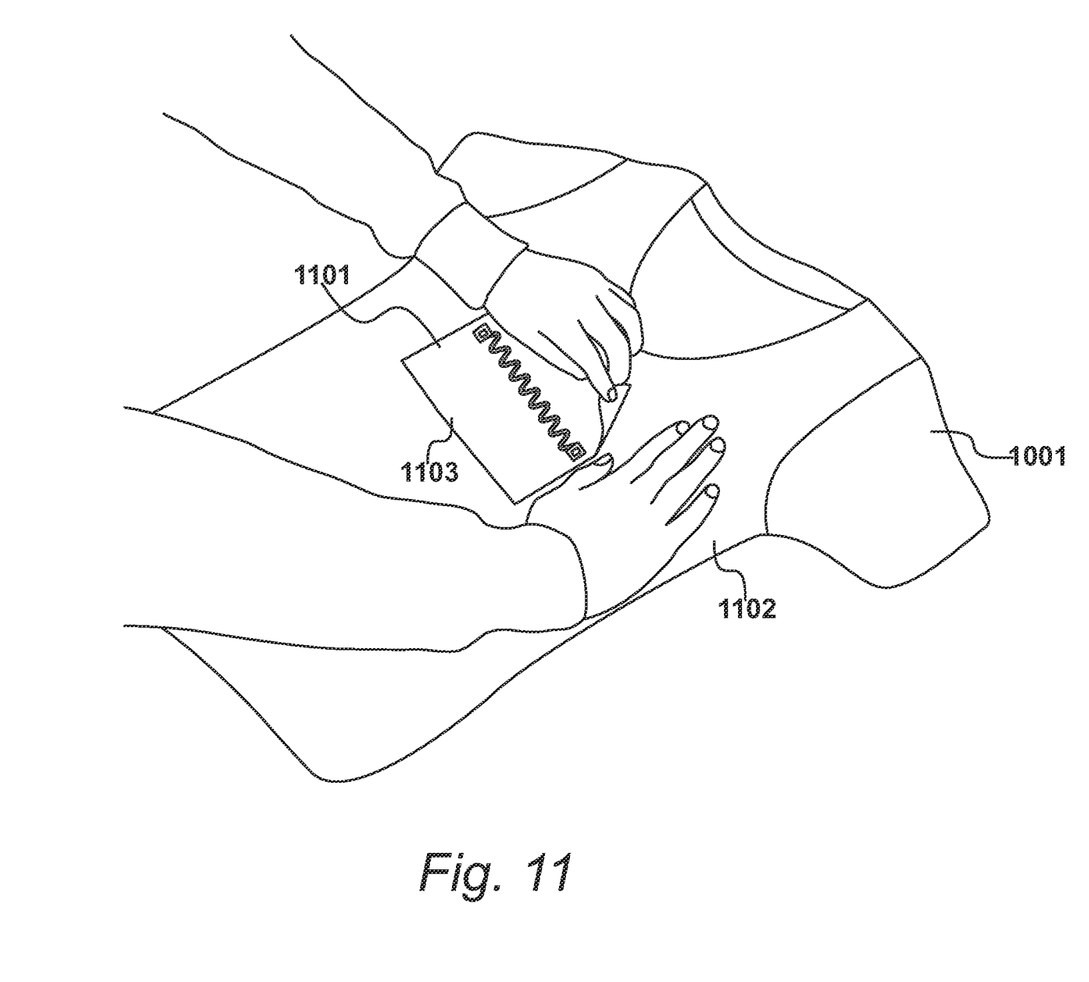
FIG. 11 shows the removal of a substrate from a conductive transfer following the application of heat and/or pressure.

FIG. 11

Following the suitable application of heat and pressure by means of heat press 1002, wearable item 1001 is removed from heat press 1002 with conductive transfer 1101 now attached to the surface 1102 of wearable item 1101. Substrate 1103 of conductive transfer 1101 is removable from the non-conductive ink layer and conductive transfer as a whole once heat and/or pressure has been applied. Thus, in this illustrated embodiment, substrate 1103 can be peeled away by an operative in the manner shown and the conductive transfer remains on the surface of wearable item 1001.

In this way conductive transfers may be supplied to market separate from the surface to which they are to be transferred to. Alternatively, this process can be conducted in conjunction with the production of the transfer itself and the final product, such as a wearable item, can be provided directly to the market.

In the embodiment, a manual heat press is utilized to adhere the conductive transfer to a surface. However it is appreciated that any other suitable machinery which is capable of applying heat and/or pressure can be used. Further, in the embodiment, both heat and pressure are applied however, it is appreciated that in alternative embodiments the transfer can be adhered to a surface by means of an application of heat only or an application of pressure only.

Figure 12:
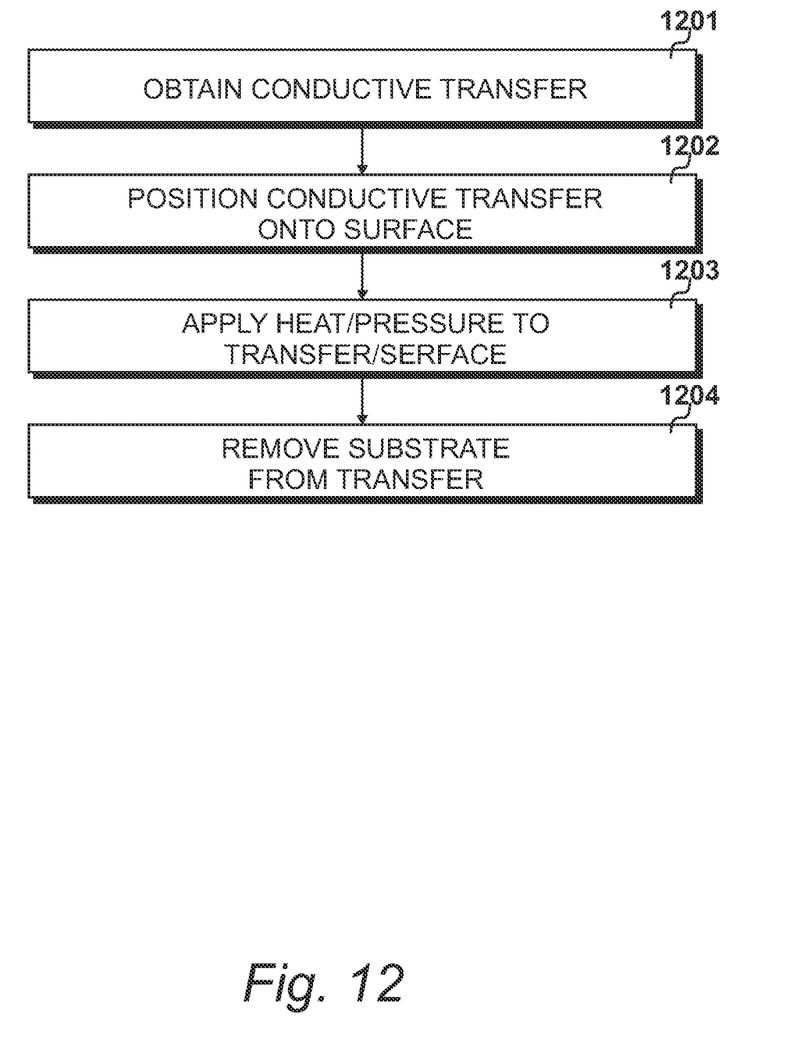
FIG. 12 shows the process of applying a conductive transfer to a surface of an article.

FIG. 12

FIG. 12 illustrates the process of applying a conductive transfer to a surface of an article. At step 1201 a conductive transfer in accordance with any of those described herein is obtained before being positioned in a suitable location on a surface to which the conductive transfer can be applied at step 1202.

Once the conductive transfer is in position, heat, pressure, or a combination of heat and pressure is applied to both the transfer and the surface at step 1203. This allows the conductive transfer to adhere to the surface due to the adhesive layer of the conductive transfer. The surface and its corresponding article can be removed from the machine for applying heat and/pressure with the transfer now attached. The substrate onto which the non-conductive and conductive inks are printed can then be removed from the conductive transfer at step 1204 such that the article retains the non-conductive and conductive layers on the surface of the article.

Thus, the present invention allows for a transfer with increased functionality which can be applied to any suitable article having a surface and provides an electrically conductive circuit within the article but which is also durable and able to withstand cleaning or washing processes.

The invention claimed is:

1. A conductive transfer for application to a surface, comprising:
a first non-conductive printed ink layer and a second non-conductive printed ink layer;
an electrically conductive printed ink layer positioned between said first non-conductive printed ink layer and said second non-conductive printed ink layer, said electrically conductive printed ink layer forming part of an electrical circuit; and
an adhesive layer for adhering said conductive transfer to a surface;
wherein
said first non-conductive printed ink layer comprises separate portions over a given cross-section of said first non-conductive printed ink layer which produce an opening in said first non-conductive printed ink layer; and
said electrically conductive printed ink layer is encapsulated by said first non-conductive printed ink layer and said second non-conductive printed ink layer over a first area produced by said separate portions and exposed at said opening to provide an electrical contact point in a second area to enable a connection to be made to said electrical circuit.

2. A conductive transfer according to claim 1, wherein said first non-conductive printed ink layer is printed onto a substrate.

3. A conductive transfer according to claim 2, wherein said substrate is removable from said first non-conductive printed ink layer following an application of heat.

4. A conductive transfer according to claim 2, wherein said substrate is removable from said first non-conductive printed ink layer following an application of pressure.

5. A conductive transfer according to claim 1, wherein said first non-conductive printed ink layer and said second non-conductive printed ink layer each comprise any one of the following: a water-based printing ink; an ultraviolet cured printing ink; a solvent based ink; a latex printing ink.

6. A conductive transfer according to claim 1, wherein said adhesive layer comprises any one of the following: a water-based adhesive; a solvent based adhesive; a printable adhesive; a powder adhesive.

7. A conductive transfer according to claim 1, wherein said electrically conductive printed ink layer comprises a geometric waveform.

8. A surface comprising the conductive transfer of claim 1.

9. A surface according to claim 8, wherein said surface comprises part of a wearable item.

10. A method of producing a conductive transfer for application to a surface, comprising the steps of:
printing a non-conductive ink onto a substrate to produce a first non-conductive printed ink layer;
curing said first non-conductive printed ink layer;
printing an electrically conductive ink onto said first non-conductive printed ink layer to produce an electrically conductive printed ink layer forming part of an electrical circuit;
curing said electrically conductive printed ink layer;
printing said non-conductive ink over said electrically conductive printed ink layer to produce a second non-conductive printed ink layer;
curing said second non-conductive printed ink layer;
printing an adhesive material over said second non-conductive ink layer to produce an adhesive layer; and
curing said adhesive layer;
wherein
said step of printing said first non-conductive printed ink layer comprises printing separate portions for a given cross section of said first non-conductive printed ink layer which produce an opening in said first non-conductive printed ink layer;

said steps of printing said non-conductive ink and said electrically conductive ink encapsulates said electrically conductive printed ink layer between said first non-conductive printed ink layer and said second non-conductive printed ink layer over a first area produced by said separate portions; and said step of printing said non-conductive ink over said electrically conductive printed ink layer creates an exposed second area which provides an electrical contact point to enable a connection to be made to said electrical circuit.

11. A method according to claim 10, wherein said adhesive layer comprises a larger cross sectional area than each of said first non-conductive printed ink layer, said second non-conductive printed ink layer and said electrically conductive printed ink layer.

12. A method according to claim 10, wherein each said step of printing comprises one or more of the following: screen-printing; reel-to-reel printing; dot matrix printing; laser printing; cylinder press printing; ink jet printing; flexographic printing; lithographic printing; offset printing; digital printing; gravure printing; xerographic printing.

13. A method according to claim 10, wherein each said step of curing comprises drying each said layer.

14. A method of applying a conductive transfer to a surface, comprising the steps of:

obtaining a conductive transfer formed by the method of claim 10, said conductive transfer having a first non-conductive printed ink layer, a second non-conductive printed ink layer, and an electrically conductive printed ink layer forming part of an electrical circuit, said electrically conductive printed ink layer being positioned between said first non-conductive printed ink layer and said second non-conductive printed ink layer;

positioning said conductive transfer onto a surface; and applying at least one of heat or pressure to said conductive transfer such that said conductive transfer adheres to said surface; wherein said first non-conductive printed ink layer comprises separate portions over a given cross-section of said first non-conductive printed ink layer which produce an opening in said first non-conductive printed ink layer; and said electrically conductive printed ink layer is encapsulated by said first non-conductive printed ink layer and said second non-conductive printed ink layer over a first area and exposed to provide an electrical contact point in a second area to enable a connection to be made to said electrical circuit.

15. A method according to claim 14, further comprising the step of: removing a substrate of said conductive transfer from said first non-conductive printed ink layer.

16. A conductive transfer according to claim 1, further comprising an electronic device.

17. A surface according to claim 9, wherein said conductive transfer is configured to monitor the heart rate, blood pressure or other vital function of a patient.

* * * * *